US009397181B2

(12) United States Patent
Alptekin et al.

(10) Patent No.: US 9,397,181 B2
(45) Date of Patent: Jul. 19, 2016

(54) DIFFUSION-CONTROLLED OXYGEN DEPLETION OF SEMICONDUCTOR CONTACT INTERFACE

(71) Applicant: International Business Machines Corporation, Armonk, NY (US)

(72) Inventors: Emre Alptekin, Wappingers Falls, NY (US); Ahmet S. Ozcan, Pleasantville, NY (US); Viraj Y. Sardesai, Poughkeepsie, NY (US); Kathryn T. Schonenberg, Wappingers Falls, NY (US); Cung D. Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 14/219,208

(22) Filed: Mar. 19, 2014

(65) Prior Publication Data

US 2015/0270179 A1      Sep. 24, 2015

(51) Int. Cl.
| H01L 29/45 | (2006.01) |
| H01L 21/8238 | (2006.01) |
| H01L 21/285 | (2006.01) |
| H01L 21/268 | (2006.01) |
| H01L 29/417 | (2006.01) |

(52) U.S. Cl.
CPC ............ *H01L 29/456* (2013.01); *H01L 21/268* (2013.01); *H01L 21/28518* (2013.01); *H01L 21/28568* (2013.01); *H01L 21/823871* (2013.01); *H01L 29/41725* (2013.01)

(58) Field of Classification Search
CPC ................. H01L 21/823871; H01L 21/28568; H01L 21/28518; H01L 21/324; H01L 29/456
See application file for complete search history.

(56) References Cited

U.S. PATENT DOCUMENTS

| 4,701,349 A | 10/1987 | Koyanagi et al. |
| 5,648,287 A | 7/1997 | Tsai et al. |
| 5,744,395 A | 4/1998 | Shue et al. |
| 5,877,077 A | 3/1999 | Kronlund |
| 5,972,774 A | 10/1999 | Matumoto |
| 6,319,769 B1 | 11/2001 | Cho |

(Continued)

FOREIGN PATENT DOCUMENTS

| EP | 0231794 A2 | 8/1987 |
| EP | 0725428 A2 | 8/1996 |

OTHER PUBLICATIONS

Alptekin et al., "Diffusion-Controlled Oxygen Depletion of Semiconductor Contact Interface", U.S. Appl. No. 14/876,924, filed Oct. 7, 2015.

(Continued)

*Primary Examiner* — Michelle Mandala
(74) *Attorney, Agent, or Firm* — Laura E. Gisler; Steven Meyers

(57) ABSTRACT

A device is created by forming a layer of dielectric material on a silicon-containing region of a semiconductor substrate. An opening is created through the layer of dielectric material, the opening having a bottom and exposing the silicon-containing region. A metal stack is formed within the opening. The metal stack includes at least a first metal film on the silicon-containing region and a second gettering metal film on the first metal film. The metal stack is annealed to cause oxygen to migrate from the substrate to the gettering metal film. A first liner is formed within the opening. A fill metal is deposited in the opening.

2 Claims, 6 Drawing Sheets

(56) References Cited

U.S. PATENT DOCUMENTS

| | | | |
|---|---|---|---|
| 6,335,557 B1* | 1/2002 | Kizilyalli | H01L 28/75 257/301 |
| 6,784,069 B1 | 8/2004 | Patraw et al. | |
| 7,157,777 B2* | 1/2007 | Tsuchiaki | H01L 21/28518 257/382 |
| 7,323,738 B2 | 1/2008 | Basceri et al. | |
| 8,026,184 B2 | 9/2011 | Horikawa | |
| 2008/0284021 A1* | 11/2008 | Anderson | H01L 21/76843 257/751 |
| 2012/0018810 A1 | 1/2012 | Chambers et al. | |
| 2012/0119302 A1 | 5/2012 | Pei et al. | |
| 2012/0196432 A1 | 8/2012 | Yan | |
| 2012/0217591 A1 | 8/2012 | Kamada | |
| 2012/0280288 A1 | 11/2012 | Ando et al. | |
| 2013/0032881 A1 | 2/2013 | Piao et al. | |
| 2014/0191329 A1* | 7/2014 | Rivero | H01L 21/28052 257/383 |
| 2015/0270178 A1* | 9/2015 | Alptekin | H01L 21/823871 257/288 |

OTHER PUBLICATIONS

Ang et al., "Effective Schottky Barrier Height Modulation Using Dielectric Dipoles for Source/Drain Specific Contact Resistivity Improvement," 2012 IEEE International Electron Devices Meeting, Dec. 10-13, 2012, p. 18.6.1-18.6.4, San Francisco, CA. D.O.I. 10.1109/IEDM.2012.6479068.

Hook et al., "Titanium Silicide/Silicon Nonohmic Contact Resistance for NFET's, PFET's, Diffused Resistors, and NPN's in a BiCMOS Technology," IEEE Transactions on Electron Devices, Apr. 1995, p. 697-703, vol. 42, Issue 4 D.O.I. 10.1109/16.372074.

Ting et al., "Investigation of the Al/TiSi2/Si contact system," AIP Journal of Applied Physics, Feb. 1983, p. 937-943, vol. 54, Issue2, © 1983 American Institute of Physics. D.O.I. 10.1063/1.332018.

Ting et al., "High Temperature Process Limitation on TiSi2," Journal of the Electrochemical Society: Solid-State Science and Technology, Dec. 1986, p. 2621-2625, vol. 133, Issue 12, ©1986 ECS—The Electrochemical Society.

Unknown, "Spiking and Epitaxial Si in Contact Holes," Electronic Materials, © H. Föll (Electronic Materials—Script) http://www.tf.uni-kiel.de/matwis/amat/elmat_en/kap_6/advanced/t6_4_1.html.

* cited by examiner

US 9,397,181 B2

DIFFUSION-CONTROLLED OXYGEN DEPLETION OF SEMICONDUCTOR CONTACT INTERFACE

BACKGROUND

This application deals generally with semiconductor manufacturing and semiconductor circuits. In particular, this application involves contact structures in semiconductor circuits, formation of silicides, and electrical properties of materials and interfaces in semiconductor circuits.

SUMMARY

Embodiments of the disclosure may be directed toward making a contact by forming a layer of dielectric material on a silicon-containing region of a semiconductor substrate; creating an opening through the layer of dielectric material, the opening having a bottom and exposing the silicon-containing region; forming a metal stack within the opening, the metal stack including at least a first metal film on the silicon-containing region and a second gettering metal film on the first metal film; annealing the metal stack to cause oxygen to migrate from the substrate to the gettering metal film; forming a first liner within the opening; and depositing a fill metal in the opening.

Various embodiments of the disclosure may be directed toward semiconductor contacts having a layer of dielectric material on a silicon-containing region of a semiconductor substrate, the layer of dielectric material having an opening that extends through the layer and that exposes the silicon-containing region; a metal silicide layer on the exposed portion of the silicon-containing region, the metal silicide layer including at least one first type of metal selected from the group consisting of titanium, tantalum, cobalt, ruthenium, rhenium, nickel, hafnium, platinum, and tungsten; a metal stack on the metal silicide layer, the metal stack including at least a first type of metal and at least a second type of metal, the second type of metal being a gettering metal; and a gettering-metal oxide layer within an upper portion of the metal stack; a liner film on the metal stack and on the layer of dielectric material; and a fill metal on the liner film, the fill metal being selected from the group consisting of tungsten, cobalt, nickel, titanium, tantalum, copper, silver and alloys thereof.

DETAILED DESCRIPTION

Figure 1:
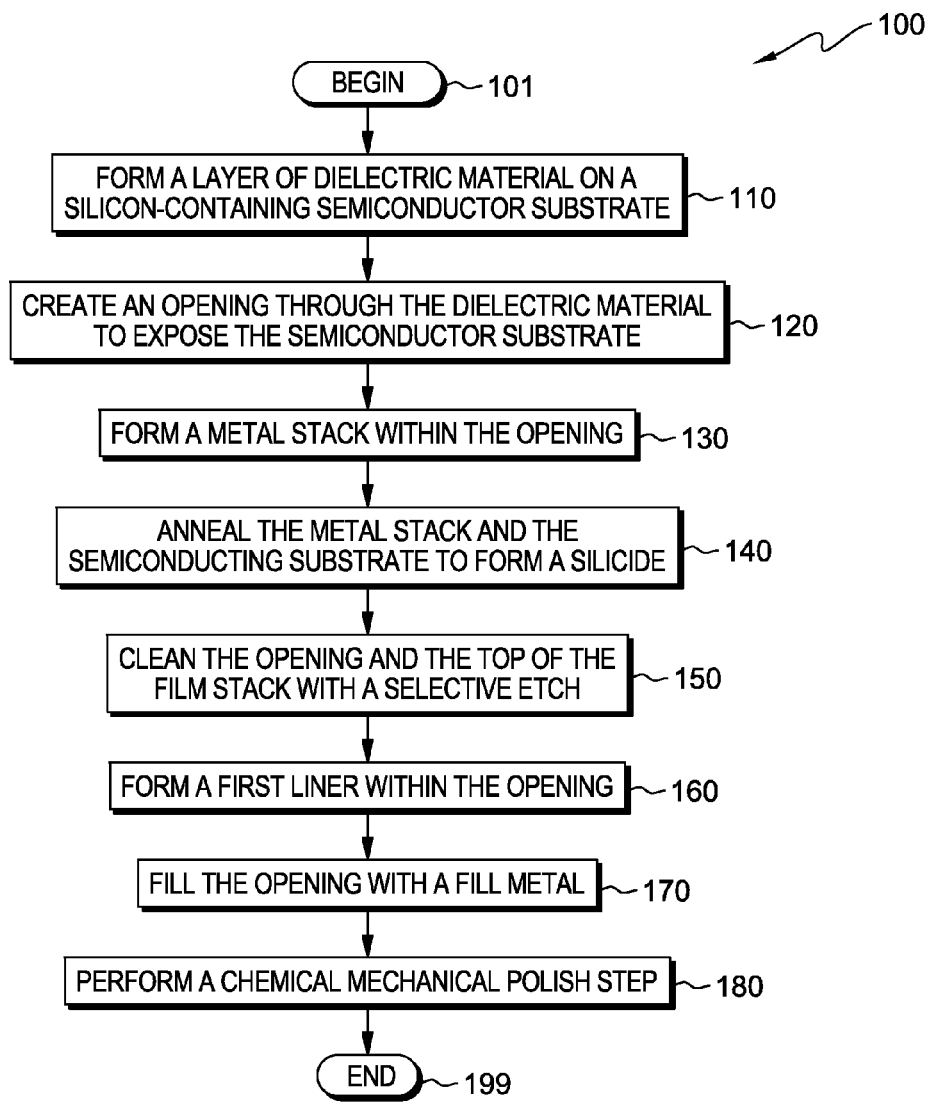
FIG. 1 describes a method of creating semiconductor circuits with adjustable metal content in the contact silicide layer, according to embodiments of the disclosure.

As semiconductor circuits become denser and their constituent elements become smaller, the interfaces between materials in semiconductor circuits become more important to the overall function and performance of the semiconductor circuit. Parasitic resistance, parasitic capacitance, and the specific contact resistivity and workfunctions of circuit elements influence the performance of semiconductor circuits as circuit elements shrink. These properties may be addressed by selecting appropriate materials for particular semiconductor circuit elements and by exercising appropriate control over the manufacturing method used to create circuit components.

Parasitic resistance and parasitic capacitance are of particular importance to the overall performance of semiconductor circuits. As the space between contacts and gates shrinks, parasitic resistance and capacitance can ruin a chip's performance characteristics. Manufacturers exercise increasingly fine control over the methods of manufacturing transistors in order to prevent trace amounts of materials from interfering with desired transistor functionality. Improved methods of manufacturing and new material combinations may also permit greater control over electrical characteristics of interface materials.

Embodiments of the present disclosure relate to methods of manufacturing semiconductor contacts and controlling their electrical characteristics by taking advantage of anneal-driven diffusion in layers of a contact structure. Controlling the chemical composition and physical structure of a semiconductor contact permits the reduction of parasitic resistance and parasitic capacitance and may also permit control of the workfunctions of the contact at the interface with the source and drain regions of a transistor. It is generally recognized that resistance and capacitance become more critical and difficult to control as semiconductor circuit elements shrink.

Parasitic resistance may be reduced by replacing conformally deposited metal oxide layers within a contact structure with metal oxides formed in situ during an anneal step out of previously deposited materials at the bottom of a contact. Parasitic capacitance may be reduced by tailoring the workfunction of the contact on a semiconductor substrate and by reducing the specific contact resistivity. Workfunction tailoring of the contact material may be accomplished by tailoring the metal content in a metal silicide layer formed at the bottom of the contact. Specific contact resistivity may be improved by reducing the amount of oxygen in the contact structure or by altering the physical location of the oxygen within the contact. Oxygen may contaminate materials to form metal oxides that hinder the smooth flow of current through the circuit and may also reduce the amount of direct connection between a substrate and a contact silicide layer.

Aspects of the present disclosure may be directed toward semiconductor contacts constructed in ways that can take advantage of diffusion between adjacent materials during anneal steps. Anneal steps may include a millisecond laser anneal or a forming gas anneal. A forming gas anneal at relatively low temperatures may allow oxygen diffusion predominate rather than metal diffusion or metal melting while millisecond laser anneals may produce higher metal diffusion rates while still avoiding film melting or crystal formation.

Intermediate manufacturing states of such contacts may include a metal stack made of multiple metal films deposited on an exposed portion of a silicon-containing region of a semiconductor substrate within an opening in a layer of dielectric material. Various embodiments of the present disclosure are directed toward controlling the chemical composition of a contact silicide by depositing multiple metal films or metal layers within the contact opening to form a metal stack before forming the silicide during an anneal step. Some of these embodiments may adjust the workfunction of the contact silicide by controlling the ratio of two metals in the silicide. Other embodiments may facilitate oxygen migration away from the contact silicide region in order to improve the specific contact resistivity. Still other embodiments may include an oxygen-containing layer in the stack that is transformed during annealing into a metal oxide layer and a metal silicide layer at the bottom of the contact, allowing manufacturers to increase the amount of dielectric material between the contact and the transistor gate (reducing parasitic capacitance).

The metal stack may be made two or more metal films, where one metal film contains a combination of metals configured to undergo a reaction with silicon or oxygen mobilized during an anneal step. The reaction of metals with oxygen or silicon may produce a tailored metal silicide or metal oxide layer within the semiconductor device. In some embodiments the configured multi-metal film may be at the top of the film stack, while in other embodiments it may be at the bottom of the film stack. Some embodiments of the present disclosure may put the configured multi-metal film directly on a silicon-containing semiconductor substrate, while others may interpose an oxygen-containing layer such as silicon dioxide between the film stack and the semiconductor substrate. Some embodiment may include a metal stack with a first metal film made of titanium and aluminum (TiAl) and a second metal film made of titanium to form a titanium aluminum silicide. Other embodiments may include a metal stack where the first metal film is composed of titanium and the second metal film is made of titanium and aluminum.

When a metal stack is annealed as part of a contact manufacturing process, silicon atoms from the semiconductor substrate and metal atoms form the metal stack may diffuse and react to form a metal silicide layer at the boundary between stack and substrate. Contacts made from metal stacks with configured multi-metal films may have concentration gradients of the component metals in the configured multi-metal film within the annealed metal stack in addition to having metal silicide layers and (sometimes) metal oxide layers within the contact structure. Concentration gradients and distribution of other elements (not metals and not silicon) within the contacts may also indicate aspects of the metal stack used to create a contact and the method of making the contact. For example, when a contact contains a uniform distribution of metal, silicon and oxygen, it may have been formed by an anneal process that melted the metal stack, whereas contacts with gradients of metal concentration or bands of metal silicides or metal oxides may have been formed from anneal processes that did not melt the metal stack but did undergo a significant degree of atomic diffusion. Further information about the anneal conditions such as maximum temperature or duration may be determined by examining the structure and location of films after the anneal. Low temperature anneals, such as a forming gas anneal, carried out for even extended periods may undergo more oxygen diffusion and less metal diffusion than a millisecond laser anneal, even if the millisecond laser anneal is of extremely short duration.

Some embodiments of the present disclosure are directed toward modifying the physical characteristics of the material used as a contact silicide that makes electrical contact with the source or drain regions of a transistor. By altering the chemical composition of the contact silicide, it may also be possible to alter the electrical properties of both the material and the interface between the contact and the source or drain region of the transistor. One such electrical property, the workfunction, describes the ease with which electrical current flows through a contact and a transistor gate. Workfunctions of metals and metallic compounds may be somewhat more difficult to model or predict than those of semiconducting materials and may be best characterized through empirical rather than theoretical techniques.

For instance, certain aspects of the present disclosure may be used to provide contacts that rest on NFET and PFET structures in the same semiconductor circuit and that have similar workfunction values, whether the contact rests on an NFET or a PFET. This may be useful because these contacts may be manufactured using a single processing step rather than dividing the NFET and PFET contact formation steps in to different, sequential manufacturing processes.

FIG. 1 describes one method 100 of producing semiconductor circuits in which the diffusion of interface materials can be controlled in order to create metal-insulator-semiconductor (MIS) contact structures with different work functions. The method 100 begins in block 101. A dielectric material is deposited on the source or drain region of a silicon-containing semiconductor substrate as shown in block 110. An opening is then created through the dielectric material to expose a portion of the semiconductor substrate, as shown in block 120. A metal stack is then deposited within the opening and on the exposed portion of the semiconductor substrate, as described in block 130.

The metal stack may include a first metal film and a second metal film on top of the first film, and each metal film may have a different chemical composition. Some of the types of metals in the metal stack may be included to modify the workfunction of the final contact produced by the method 100. For example, when titanium is the main metal in the metal stack, the workfunction-adjusting metal may include aluminum, platinum, and iridium for contacts formed on PFETs. Contacts formed on NFETs using titanium as the primary metal may also include aluminum, ytterbium, and erbium as workfunction-adjusting metals.

The semiconductor substrate and metal stack may be annealed with a millisecond laser anneal to form a silicide layer, as shown in block 140. The contact opening and the top of the metal stack may then be cleaned with a selective etch process, as shown in block 150. This selective etch process may include a liquid cleaning process using mixtures of sulfuric acid and hydrogen peroxide or other liquid chemistries.

The selective etch may also include a plasma etch step. The clean process may be intended to remove metals from the top surface of the wafer and from within the contact opening. A liner layer may then be deposited within the opening and on top of the second metal film, as shown in block 160. The liner can be a titanium nitride film or other film that impedes diffusion into the dielectric material. The space within the opening may then be filled with a fill metal such as titanium, tantalum, cobalt, ruthenium, rhenium, nickel, platinum, hafnium, tungsten, and alloys thereof, as shown in block 170. Finally, the top surface of the wafer may be planarized using a chemical mechanical polishing process to produce a uniform surface for subsequent manufacturing steps, as shown in block 180. The method ends in block 199.

Figure 2:
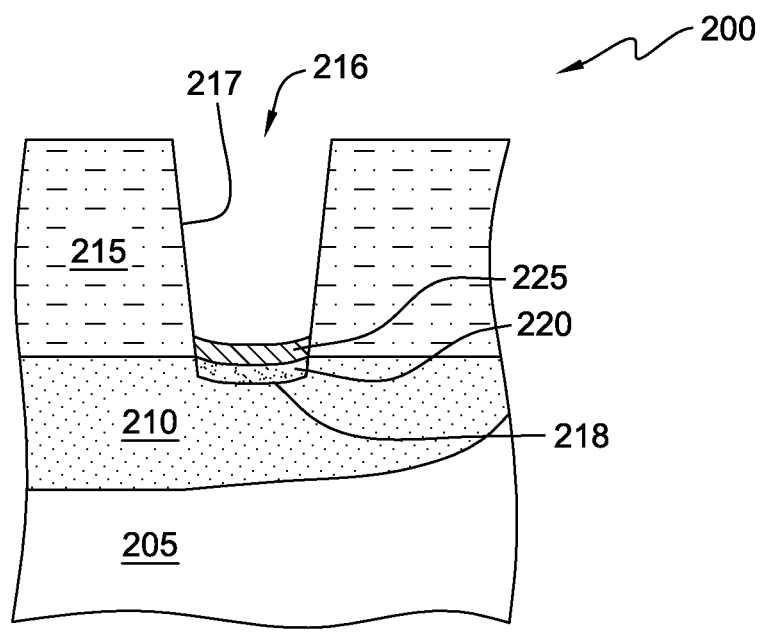
FIG. 2 portrays an arrangement of films in semiconductor circuits that can be created using methods similar to that described in FIG. 1, according to embodiments of the disclosure.

FIG. 2 portrays embodiments of an intermediate structure 200 produced when making a semiconductor circuit using controlled-diffusion processing to adjust the work function of a contact on a PFET or NFET structure. A dielectric material 215 is deposited on a silicon-containing region 210 of a semiconductor substrate 205. An opening 216 is formed in the dielectric material 215, the opening having a sidewall 217 and a bottom 218. The etching process used to create the opening 216 may penetrate slightly into the silicon-containing region 210 of the semiconductor substrate 205.

As described herein, a first metal film 220 may be deposited at the bottom of opening 216. A second metal film 225 may then be deposited on top of the first metal film 220. The first metal film 220 may be composed of at least two metals, including titanium and aluminum. The inclusion of a second metal in the first metal film may modify the workfunction of the metal silicide at the bottom of the contact. For example, a contact made by annealing a metal stack having a first metal film made of titanium and aluminum and a second metal film made of titanium may produce a titanium-aluminum silicide. In certain embodiments, the structure can be configured such that the resulting contact can exhibit a workfunction when constructed on an NFET (n-channel field-effect transistor) and may also exhibit a workfunction that is roughly similar when constructed on a PFET (p-channel field-effect transistor). This can be particularly useful for using a single contact forming process to produce contacts for both NFET and PFET components on the same semiconductor wafer.

The total amount of workfunction-altering metal present in the metal stack may be regulated by adjusting the total thickness of the film that contains the altering metal in the metal stack. When the metal layer that contains the workfunction altering metal is deposited from a metal target with fixed concentration, the workfunction adjustment may be dynamically altered during a manufacturing process by altering the thickness of the metal film that contains the altering metal. In some embodiments, the first metal film 220 may range in thickness down to 1 nm and up to 8 nm. Alternative embodiments may use deposition targets with different compositions, e.g., 70% titanium and 30% aluminum, to achieve a desired level of aluminum in the first metal film while independently regulating film thickness. If, for example, a first metal film contains approximately 50% titanium and 50% aluminum, and a second metal film contained titanium, the thickness of the first metal film may be significant in determining the aluminum content in a metal silicide layer and the workfunction of the contact. In embodiments where the first metal film and the second metal film are approximately 4 nm thick, the stack may contain approximately 25% aluminum.

The composition of the metal silicide incorporating aluminum and titanium from the first metal film may rely heavily on the content of the first metal film 220, but the thickness and composition of the second metal film 225 may also impact the composition of the final silicide. In some embodiments, second metal 225 film may, like the first metal film, range in thickness from as low as 1 nm and up to 8 nm. The second metal film 225 may be composed of one or more metals, some types of which may be the same as found in the first metal film 220.

Embodiments of the intermediate structure 200 may undergo subsequent processing including annealing steps to produce a complete contact structure. Unlike rapid thermal processing anneals or nanosecond anneals, millisecond laser anneals may achieve an intermediate regime in terms of substrate temperatures and exposure times that produce a controllable amount of diffusion between adjacent materials in a contact stack that results in tailored electrical properties or chemical layer formation. A millisecond laser anneal may be performed using a carbon dioxide laser or other laser pulse which may heat the substrate and film stack to temperatures between 600° C. and 1100° C. for periods of 0.1 ms to 2 ms. Anneal process that are within this temperature and time processing window may have reduced risks of accidental melting of the metal films on the silicon within the contact opening and may form a final structure indicative of an anneal dominated by diffusion instead of melting (e.g., a structure with highly non-uniform distribution of metals in the film). Use of a millisecond laser anneal process step may also be beneficial when processing metal films containing titanium because it may permit formation of small, rather than large, crystalline grains in the resulting annealed material.

Nanosecond anneals may raise the temperature of a film stack and some portion of the underlying semiconductor substrate to target temperatures between 1000° C. and 1500° C. and durations of 50 to 200 ns. Nanosecond anneals that achieve higher temperatures may lead to melting of the metal films at the bottom of the contact opening, producing a uniform elemental distribution within the metal film. Nanosecond anneals that achieve lower temperatures or that last for shorter periods of time may produce insufficient elemental diffusion to form sufficient metal silicide layers at the bottom of the contact opening or proper functioning semiconductor circuits.

Figure 3:
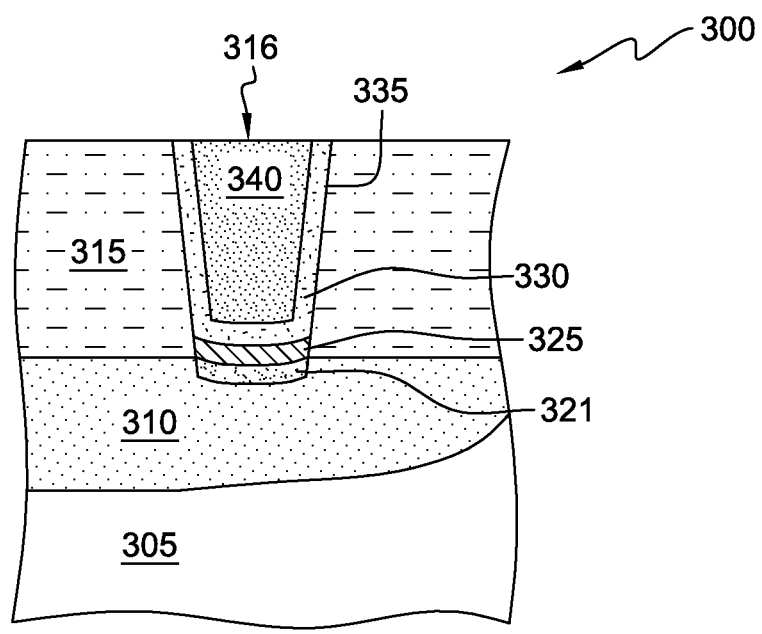
FIG. 3 portrays a semiconductor contact that can be created by methods similar to that described in FIG. 1 and having a silicide layer on a silicon-containing region of a semiconductor substrate, according to embodiments of the disclosure.

FIG. 3 portrays a semiconductor contact 300 created using controlled-diffusion processing to adjust the work function of contacts on NFET and PFET structures, consistent with embodiments of the present disclosure. A semiconductor substrate 305 contains a silicon-containing region 310. The silicon-containing region 310 may be implanted with boron or phosphorous in order to facilitate formation of a channel within the semiconductor substrate 305. A dielectric material 315 deposited on the doped region 310 contains an opening 316, the opening containing a silicide layer 321 on the exposed portion of the silicon-containing region 310 of the semiconductor substrate 305. Consistent with embodiments, the semiconductor contact 300 can be created by annealing and other steps, such as filling or polishing, the intermediate structure 200, as may be consistent with the methodology described in connection with FIGS. 1 and 2.

Aspects of the present disclosure relate to the recognition that alternative metals may such as titanium and aluminum may form silicides that provide contacts with similar workfunctions on both NFET and PFET structures in the same semiconductor circuit in a single manufacturing process, rather than sequential manufacturing process (one for NFET contacts and one for PFET contacts). Contact silicide interfaces that are constructed from combinations of nickel and platinum can be formed with relative ease, may have small workfunctions, and the difference in workfunctions of nickel-platinum silicides on NFET and PFET structures may be relatively small. The development of smaller semiconductor circuit elements, however, may require alternative materials such as titanium-aluminum silicides in order to achieve these objectives. Although titanium may be used for to form titanium silicide in small-dimension contacts, forming titanium silicide in PFET contacts tends to be difficult, especially when the PFET source and drain areas are composed of silicon germanium. The Schottky barrier height of titanium silicides in contacts that rest on PFET structures is typically higher than for those that rest on NFET structures, resulting in energy loss and degraded device performance in affected semiconductor circuits. However, the Schottky barrier height for contacts that land on NFET and PFET structures may be adjusted by changing the chemical composition of the contact silicide on the silicon-containing semiconductor substrate beneath the transistor.

When a first metal film that includes titanium and aluminum is annealed to form a metal silicide, the total fraction of aluminum in the newly-formed metal silicide 321 can be kept below 75% in order to avoid the stoichiometric elemental ratio that may lead to the formation of undesirable $TiAl_3$. Devices having silicide layers where the fraction of aluminum is greater than 30% may experience failures due to spiking or voids that form via diffusion during annealing or normal operation. The fraction of aluminum may be reduced below 30% in order to prevent spiking and void formation while still affording modification of the workfunction of the contact silicide. Final aluminum concentrations in the silicide layer above 10% may be desirable to prevent formation of solid solutions of titanium and aluminum where the aluminum is uniformly distributed within the titanium.

The silicide layer 321 having a tailored amount of workfunction-altering metal incorporated therein, lies beneath metal layer 325 at the bottom of the contact. The workfunction of the contact can be similar whether the contact rests on an NFET or a PFET structure, depending on the dopant in region 310. A liner layer 330 rests on the sidewall of the opening 335 and on the second metal film 325. Metal layer 325 and silicide layer 321 may jointly be called a metal stack within the opening and may have been formed during the anneal of at least one metal film deposited during the manufacturing process. Metal layer 325 may have multiple types of metal and may contain gradients of metal concentrations through it. A fill metal 340 has been deposited within opening 316 on top of liner layer 330. Liner layer 330 may be made of titanium nitride or some other diffusion barrier that may prevent metal migration from the contact structure into dielectric material 315. The fill metal 340 may be tungsten or some other metal which can be deposited into a contact opening 316, whether by electroplating, sputtering, or some other method.

Figure 4:
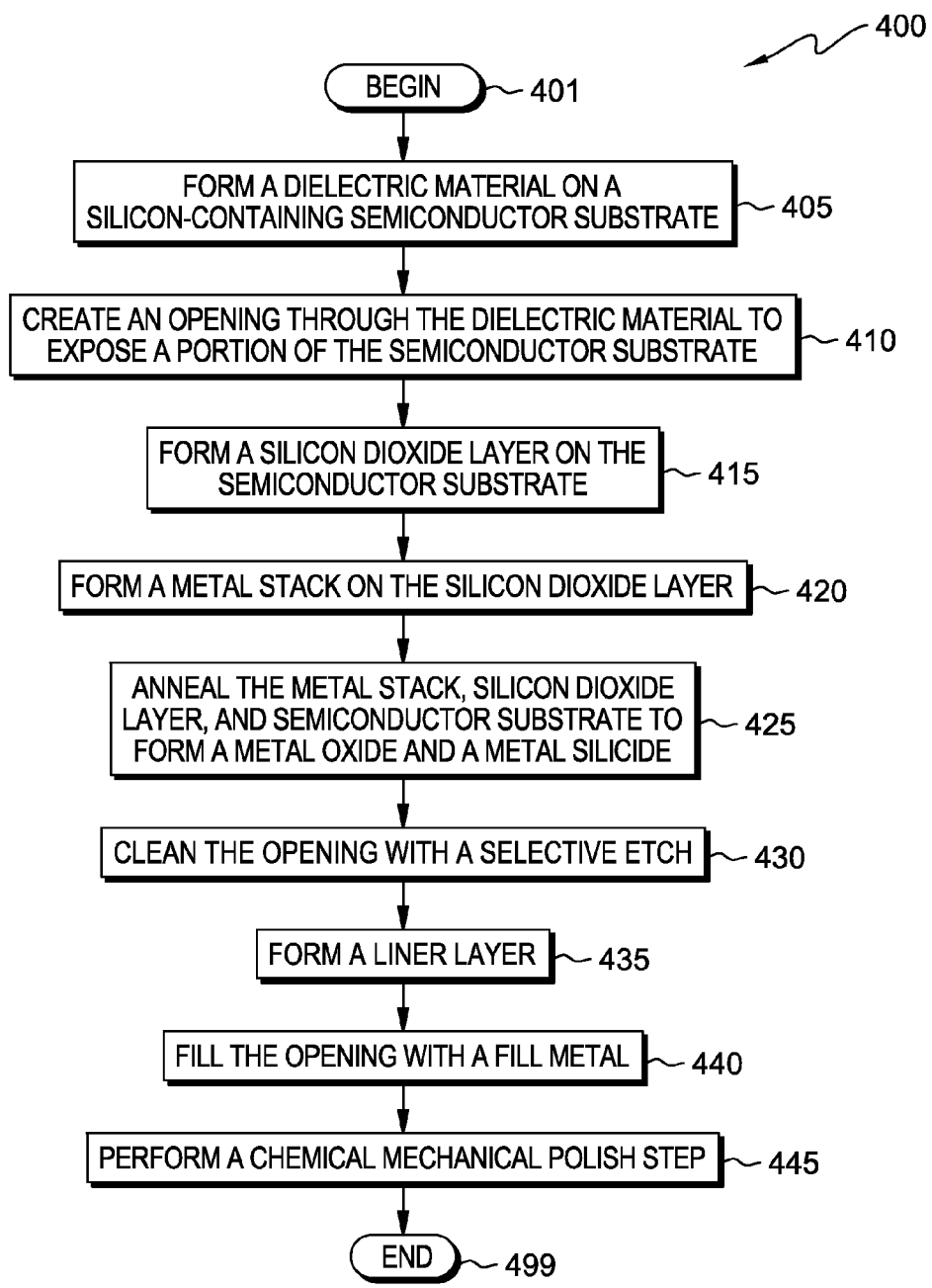
FIG. 4 describes a method of creating semiconductor circuit contacts using a layer of silicon dioxide that reacts with metal films, according to embodiments of the disclosure.

FIG. 4 describes a method that may be used to create embodiments of metal-insulator-semiconductor (MIS) contact structures. The method begins with block 401. A dielectric material is first deposited on a silicon-containing region of a semiconductor substrate, as shown in block 405. Next, an opening may be created in the dielectric material to expose a portion of the silicon-containing region of the semiconductor substrate, as shown in block 410. A silicon-containing oxide layer, for example silicon dioxide, may then be formed on the exposed silicon-containing region of the semiconductor substrate, as shown in block 415. The silicon-containing oxide layer may be grown from an aqueous peroxide mixture, from exposure to atmosphere, or by a thermal oxidation technique. The oxide layer may further have a thickness between 0.5 and 3 nm. The silicon-containing oxide layer may contain one or more other elements, for example nitrogen. A metal stack may then be formed on the silicon-containing oxide layer, as shown in block 420. The metal stack may include a first metal film and a second metal film deposited sequentially on the silicon-containing oxide layer. The first metal film and the second metal film may each have a thickness between 1 nm and 8 nm according to embodiments of the present disclosure.

The semiconductor substrate, the silicon-containing oxide layer, and the metal stack may then be annealed using a millisecond laser anneal (MLA) to form a metallic oxide layer on top of the semiconductor substrate and a metal silicide layer above the metallic oxide layer, as shown in block 425.

After annealing, the opening may be cleaned with a selective etch process, as shown in block 430. The selective etch process may include a liquid sulfuric acid/hydrogen peroxide mixture and a plasma etch process to remove metal within the opening. A liner layer may then be formed within the opening and on the second metal film, as shown in block 435. The opening then may be filled with a fill metal such as tungsten or nickel, as shown in block 440. The top surface of the silicon wafer on which the contact is being formed may then be planarized using a chemical-mechanical polishing step, as shown in block 445, in order to remove excess material deposited on the top of the wafer, to expose the top surface of the dielectric material, and to make the top surface of the contact's metal fill level with the top surface of the dielectric material. The method ends in block 499.

Figure 5:
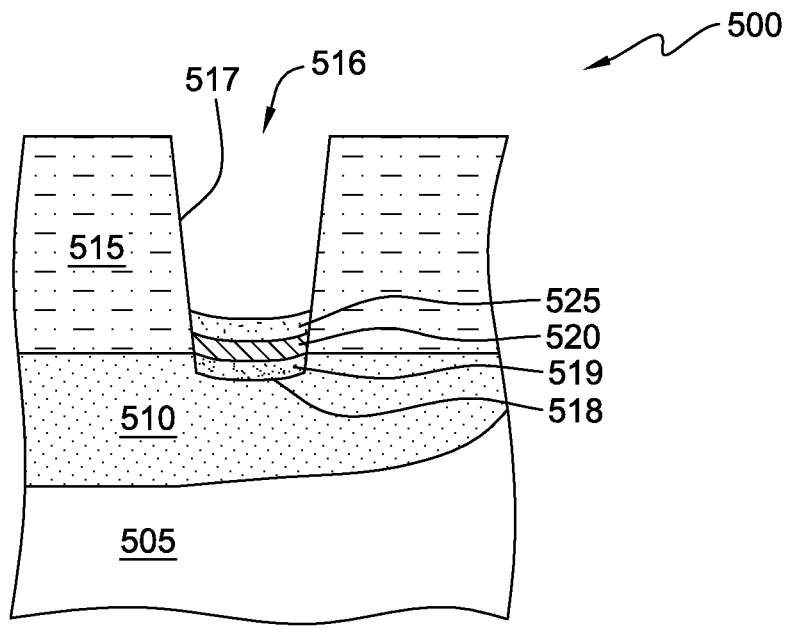
FIG. 5 portrays an intermediate state of a semiconductor contact with at least one metal film rests on a layer of silicon dioxide, according to embodiments of the disclosure.

FIG. 5 portrays embodiments of intermediate manufacturing structures 500 that may be used to form contacts, created using methods similar to those described in FIG. 4. A dielectric material 515 has been deposited on a silicon-containing region 510 of a semiconductor substrate 505. The silicon-containing region 510 may contain boron or phosphorous dopants implanted in the semiconductor substrate in order to create a source or drain region of a field-effect transistor. An opening 516 in the dielectric material 515 has a sidewall 517 and a bottom 518. In some embodiments, the bottom 518 of the opening 516 may penetrate slightly into the silicon-containing region 510.

A silicon-containing oxide layer 519 rests on the silicon-containing region. Silicon-containing oxide layer 519 may be deliberately grown using a chemical treatment such as exposure to a hydrogen peroxide solution, or may be "native oxide" that results from exposure to atmospheric oxygen and water vapor. In certain embodiments, silicon-containing oxide layer 519 may range in thickness between 0.5 nm and 3 nm. A metal stack made of a first metal layer 520 and a second metal layer 525 may be deposited within opening 516 on top of silicon-containing oxide layer 519. The silicon-containing oxide layer 519, the first metal layer 520, and the second metal layer 525 all extend to touch the sidewall 517 of the opening 516 on every side and, though not shown in the figure, may line the opening. Thus, the first metal layer 520 is in contact with the bottom 518 of the opening 516 (and silicon containing substrate 510) and lines the sidewalls 517 as well to be in contact with the dielectric material 515. The second metal layer 525 is formed on and in contact with the first metal layer 520.

The arrangement of silicon containing substrate 510, silicon-containing oxide layer 519, and the first metal layer 520 and second metal layer 525 is such that performing a millisecond laser anneal may produce a relatively high degree of diffusion between and through these films without any melting. Melting in the contact film stack can produce a uniform atomic distribution within the final contact structure, and thus, various embodiments use controlled diffusion from a millisecond laser anneal, such as one described in connection with FIG. 2 (temperatures between 600° C. and 1100° C. and a duration between 0.1 ms and 2 ms). This process may create discrete layers within the contact stack, including a metal (e.g., aluminum or lanthanum) oxide and a metal silicide (e.g., TiAl silicide).

The first metal film and second metal film associated with the creation of these discrete layers may each be between 1 nm and 8 nm in thickness. For example, some embodiments may include a layer of thermally grown silicon dioxide that is approximately 2 nm thick, upon which have been deposited a first metal film of 50% titanium and 50% aluminum that is about 4 nm thick and a second metal film made of titanium that is also about 4 nm thick. In such a stack, both the oxygen from the oxide layer 519 and the metals in the metal stack and the oxygen in the silicon dioxide may diffuse to produce a metal-insulator-silicon (MIS) contact structure, where a layer of a metallic oxide such as aluminum oxide $Al_2O_3$ beneath a metal silicide layer that may form, and the semiconductor substrate.

Aluminum oxide may be a preferable form of metallic oxide grown on PFET structures, while lanthanum oxide ($La_2O_3$) may be a preferable form of metallic oxide grown on NFET structures. When aluminum or lanthanum may act as a gettering metal, titanium, tantalum, cobalt, ruthenium, rhenium, nickel, platinum, hafnium and tungsten and their alloys may make up the remainder of the first metal film and some or all of a second metal film in the metal stack.

In certain embodiments, the fraction of gettering metal (e.g., aluminum or lanthanum) in the first metal film may range from 30% to 70%, although concentrations beyond these values may be possible depending on the device structure and the other types of metal in the metal stack. Metallic oxides such as aluminum oxide or lanthanum oxide at the bottom of contact structure may serve as diffusion barriers for dopant atoms in source or drain regions while still permitting current to tunnel between the contact silicide layer and the source or drain region of the transistor.

Aspects of the present disclosure relate to the recognition that growing a metal oxide layer 519 in situ on top of the exposed portion of the semiconductor substrate 518 permits manufacturers to realize a smaller contact opening during the manufacturing process than may be possible absent the in situ film growth during millisecond laser anneal steps. The space saved by realizing a smaller contact opening may be used for increasing the amount of dielectric material 515 between the contact opening and the transistor gate to decrease the amount of parasitic capacitance in the semiconductor circuit. More particularly, methods of forming metallic oxide layers in contact openings include atomic layer deposition (ALD), which deposits a conformal layer of a metallic oxide such as aluminum oxide or lanthanum oxide on the top of the wafer surface, on the side or wall of the contact opening, and on the exposed silicon-containing source or drain region of an NFET or PFET. In order to have a sufficiently wide opening within the contact to receive metal fill, the original opening must be wider to accommodate the layer of a (e.g., ALD deposited) metallic oxide on the sidewall. This results in an effective reduction of the dielectric material thickness between the contact and the gate structure in the transistor.

The first metal layer can include a combination of metals, for example titanium and aluminum, which have been sputtered from a single fixed-concentration target. In some embodiments the titanium and aluminum ratio in the first metal may be approximately 50/50 and the second metal layer may be titanium. The order of deposition and the thickness of the first and second metal layers will determine what films are formed by a subsequent anneal. In this MIS embodiment, the first metal layer 520, which is in contact with the substrate, contains an oxygen consuming layer such as aluminum. Aluminum is one possible oxygen consuming metal or gettering metal that may be included in a layer of the metal stack. In an embodiment the first metal layer is about 4 nm thick and the second layer is about 4 nm thick. It has been discovered that there is a range of first and second metal thicknesses which yield low sheet resistance values for many types of semiconductor substrates on which the contact may rest. The low resistance values, for many different types of semiconductor substrates and over a range of millisecond laser anneal temperatures (800-1000° C.), was discovered for metal stack configurations (before annealing) where the thickness of the top layer (the second metal layer) is between about 4 to 6 nm, as deposited, while the thickness of the bottom layer (the first metal layer) is between about 2 to 4 nm.

Figure 6:
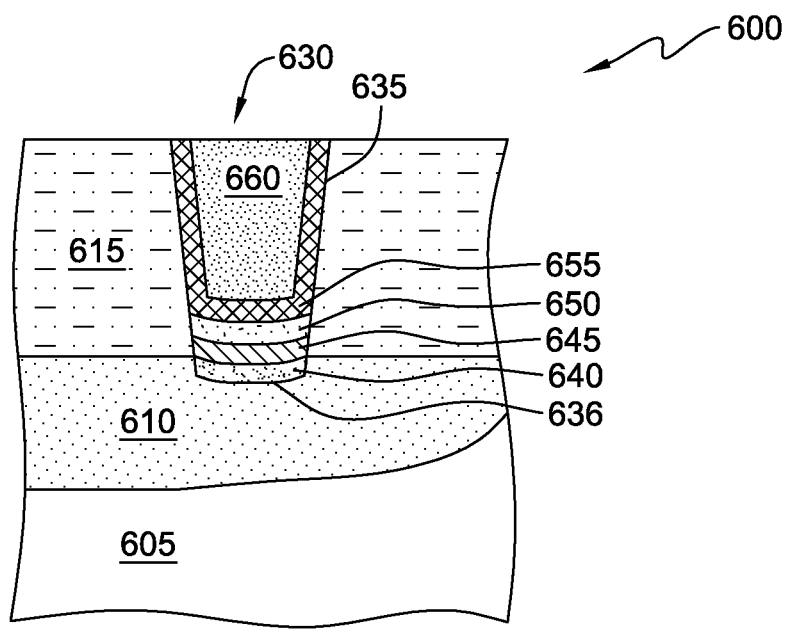
FIG. 6 portrays a semiconductor contact with a metal oxide layer at the bottom of a contact, according to embodiments of the disclosure.

FIG. 6 portrays an embodiment of a metal-insulator-semiconductor contact 600. The contact 600 may be formed from an intermediate manufacturing structure 500, e.g., by performing an anneal process, followed by liner deposition and metal fill steps. An opening 630 in the dielectric material 615 extends through the dielectric material 615. The anneal as described in conjunction with FIG. 4, results in the reaction of the first metal layer, second metal layer, substrate and sidewalls of the opening. In one embodiment, the reaction results in the formation (on the bottom of the opening 630 of a dielectric material 615) of a metallic oxide 640 that rests on the exposed silicon-containing region 610 of a semiconductor substrate 605. The metallic oxide 640 may be an aluminum oxide, as may be preferable on PFET structures, or a lanthanum oxide, as may be preferable on NFET structures. A silicide layer 645 rests on the metallic oxide 640 at the bottom of the opening, and a metal layer 650 lies on the silicide layer 645. The metallic oxide 640, silicide layer 645, and metal layer 650 all touch the sidewall 635 of the opening 630.

Aspects of the present disclosure may be directed toward methods of making contacts by diffusing metals and oxygen in silicon-containing oxides to form a metallic oxides 640. Metallic oxides formed with these more reactive metals, which may be called gettering metals, may be incorporated into a contact, such as a metal-insulator-semiconductor contact. The gettering metal may be aluminum, lanthanum, or some other metal, so long as the metal reacts preferentially among the metals present in a metal stack as oxygen is diffused through the stack.

Formation of relatively discrete layers of metallic oxide in a contact stack is a diffusion-driven process. During an anneal step, silicon atoms from the silicon-containing oxide may diffuse upward into the metal stack to form a metal silicide, while metal from the first metal film in a metal stack may diffuse downward to react with oxygen and trap it by forming a metal oxide layer. Millisecond laser anneals, such as are mentioned in connection with FIG. 3, promote the migration of metal, oxygen, and silicon atoms but may not sufficiently heat contact films to actually melt materials. Melting materials produces a homogenous distribution of elements rather than discrete layers of silicide, oxide, and the like.

Reactive gettering metals such as aluminum and lanthanum and may be deposited in first metal films in having varying proportions of gettering metal. The gettering metal may also be called an oxygen-consuming metal because of its ability to preferentially bind with diffusing oxygen during under certain anneal conditions. The gettering metal may be used to consume or bind oxygen or some other diffusing element in the stack after appropriate placement of the gettering metal within the stack, whether at the top, bottom, or in the middle of the stack.

As discussed herein, when using atomic layer deposition (ALD), chemical vapor deposition (CVD), or some other method of depositing materials, the traditional methods of depositing a metal oxide layer within a contact places it between the metal (conductive) layers and the dielectric material of the opening sidewall. Consistent with embodiments of the present disclosure, intermediate manufacturing structures for contacts may have the first metal layer (FIG. 5 element 520) and the second metal layer (FIG. 5 element 525) in direct contact the dielectric material sidewall. After a millisecond laser anneal, the metal silicide 645 layer formed in the final contact structure may also be in direct contact with the dielectric material sidewall.

Some aspects of the present disclosure may use a millisecond laser anneal (MLA) to form a metal silicide and a metal oxide simultaneously when a metal stack rests directly on a silicon-containing oxide layer at the bottom of a contact opening. Millisecond laser anneals may heat the semiconductor wafer and its superimposed film stack to temperatures between 600° C. and 1100° C. for periods of time between 0.1 and 2 milliseconds in duration. The temperatures achieved in a millisecond laser anneal may drive diffusion of metal atoms, oxygen, and silicon into adjacent films to promote formation of metal silicides and metal oxides without running the risk of melting the materials. Simultaneous in situ formation of metal silicides and metal oxides at the bottom of a contact opening may allow contact formation with a narrower opening, increasing the amount of dielectric material between a completed contact and the transistor gate.

In some embodiments, additional metal layers are formed within the opening (after annealing) to finish the MIS contact. In other embodiments, the additional metal layers may be deposited within the opening prior to an annealing step. For instance, a liner layer 655 may be on the metal layer 650 and in contact with the dielectric material 615 at the sidewalls 635 of the opening 630. The liner layer 635 may be made of titanium, titanium nitride, or some other metal-containing liner material which serves to prevent diffusion into the dielectric material 615 or to promote adhesion. A fill metal 660 takes of the remainder of the contact volume on top of the liner layer 655. The fill metal 660 may be tungsten, cobalt, nickel, titanium, tantalum, copper, silver and alloys thereof.

Figure 7:
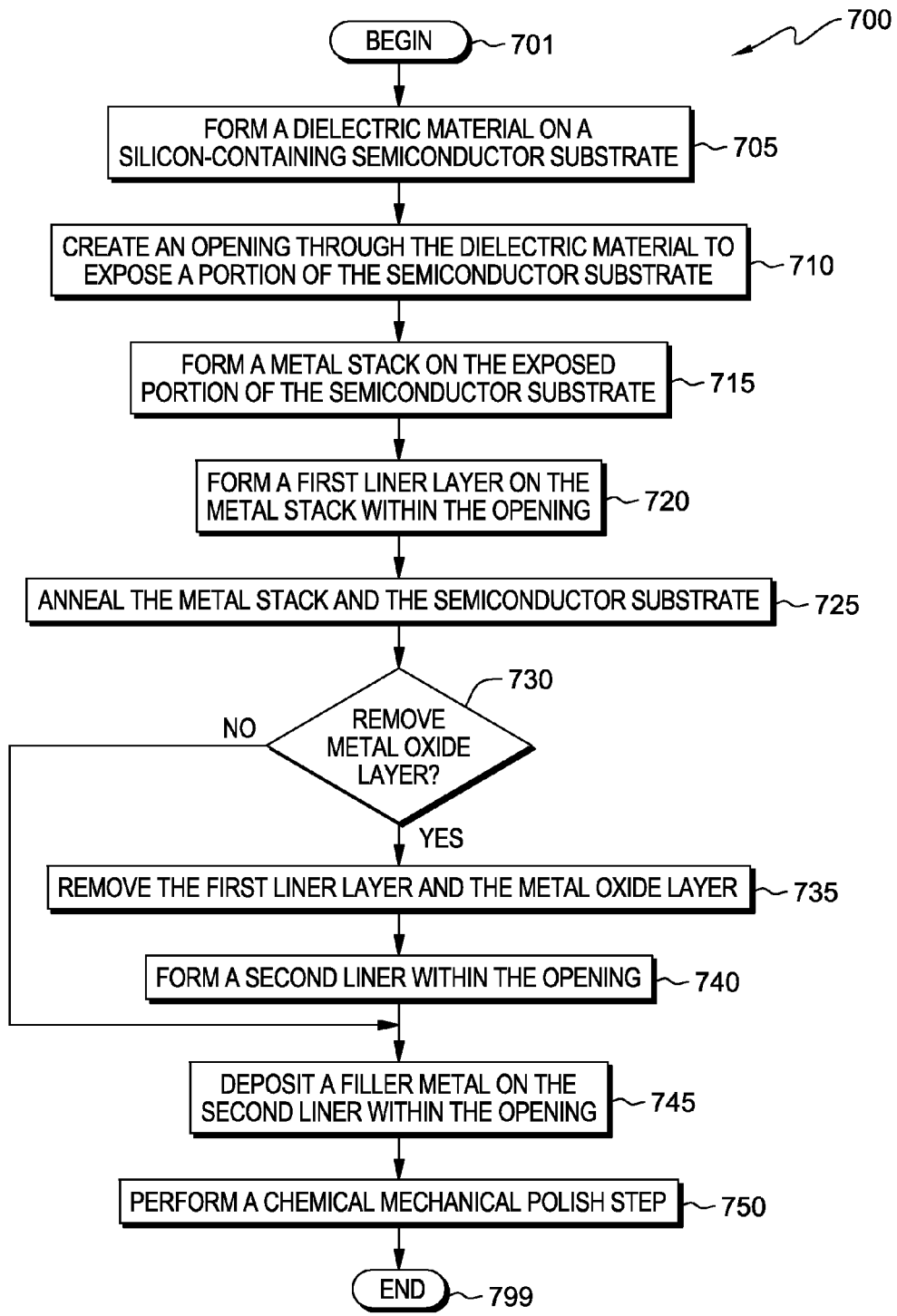
FIG. 7 describes a method of creating of semiconductor circuits wherein oxygen present beneath metal films deposited in the contact opening is diffused away from the junction of the contact and the semiconductor substrate by a forming gas anneal process, according to embodiments of the disclosure.

FIG. 7 describes a method 700 of using controlled-diffusion to deplete the region between a contact and the silicon-containing semiconductor substrate of oxygen to improve specific contact resistivity and to reduce parasitic resistance. The method begins with block 701. In certain embodiments, a layer of dielectric material is deposited onto a silicon-containing semiconductor substrate, as shown in block 705. An opening may then be created through the dielectric material to expose a portion of the semiconductor substrate, as shown in block 710. A metal stack may then be formed within the contact opening, as shown in block 715. The metal stack may include a first metal film deposited directly on the semiconductor substrate within the opening, and a second metal film deposited on the first metal film. In some embodiments, a first liner layer may optionally then deposited on the second metal film and on the sidewall of the contact opening, as shown in block 720.

The semiconductor substrate, metal stack, first liner layer, and the dielectric material may be annealed with a forming gas anneal to allow trace amounts of oxygen from silicon dioxide at the interface of the semiconductor substrate and the first metal film to migrate upward through the metal stack to form a gettering-metal oxide layer in the upper portion of the metal stack, as shown in block 725. For example, in embodiments where aluminum, acting as the gettering metal, reacts with oxygen in the top portion of a titanium metal stack during a forming gas anneal at 400° C. for approximately 2 hours, a layer of titanium-aluminum oxide may form at the top of the metal stack near the titanium nitride liner layer.

Following the anneal, the gettering-metal oxide may be removed or left intact, according to a decision made during the manufacturing process, as described in block 730. When the gettering-metal oxide is to be left intact, a fill metal may be deposited on the first liner layer within the opening, as described in block 745. However, when the gettering-metal oxide is to be removed, the gettering-metal oxide, the first liner layer and gettering-metal oxide may be removed using a selective etch process, as shown in block 735. The titanium nitride liner and the titanium-aluminum oxide may be removed by an etch process such as plasma processing steps or a selective wet chemical etch that removes titanium nitride and the titanium-aluminum oxide while leaving behind the lower portion of the metal stack, including any metal silicide formed in the metal stack. The selective etch process may be a liquid-based etch using sulfuric acid and hydrogen peroxide. The selective etch process, whether plasma or wet etch, may remove trace metals or other materials from the sidewall of the opening as well as removing an upper portion of the film stack.

Next, a second liner layer may be formed on top of the metal stack, as shown in block 740, and a fill metal may be deposited within the opening as shown in block 745. The metal fill may be tungsten, cobalt, nickel, titanium, tantalum, copper, silver, and alloys thereof. Finally, the upper surface of the contact may be planarized using a chemical-mechanical polishing step as shown in block 750 before the method ends in block 799.

Figure 8:
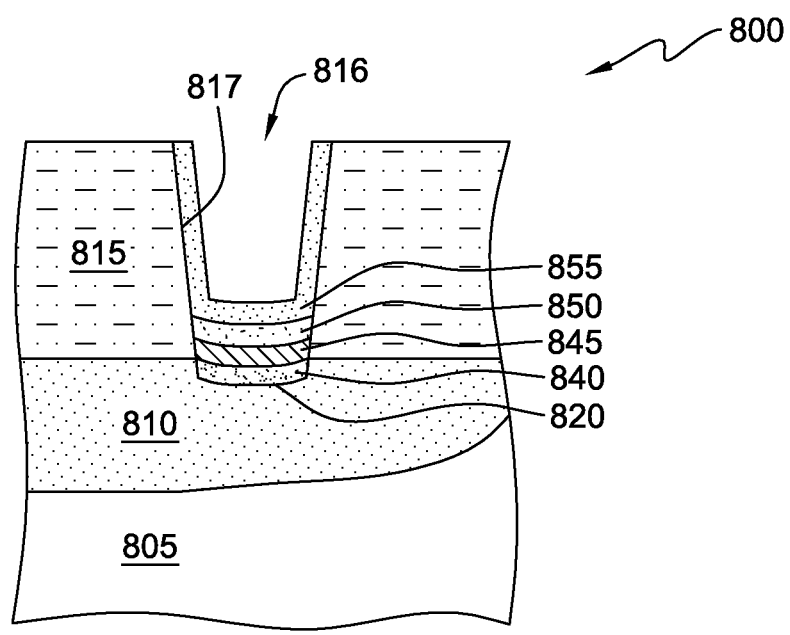
FIG. 8 shows intermediate manufacturing states of semiconductor contact structures that may be created using processes similar to the one described in FIG. 7, according to embodiments of the disclosure.

FIG. 8 shows an intermediate structure 800 created during the manufacture of embodiments of semiconductor contacts. A dielectric material 815 is deposited on the silicon-containing region 810 of a semiconductor substrate 805. An opening 816 has been created in the dielectric material 815, where the opening has a sidewall 817 and a bottom 820.

An oxygen-rich layer 840 is on the silicon-containing region 810. Oxygen-rich layer 820 may be a complete layer of silicon dioxide that fully covers the exposed portion of silicon-containing region, or it may incompletely cover silicon-containing region. A first metal layer 845 has been deposited on the oxygen-rich layer 840, and a second metal layer 850 has been deposited on the first metal layer 845. In embodiments where the first metal layer 845 contains a single metal (e.g., titanium) and a second metal layer 850 contains a combination of metals (e.g., 50% titanium and 50% aluminum), the oxygen-rich layer may be a "native oxide" or a residual oxide layer that has the potential to contaminate the contact structure.

As discussed herein, metals in the stack can be selected based on their affinity for oxygen as it diffuses in a forming gas anneal. Metals with strong affinity that will trap oxygen are located in the second metal film 850, while metals with low affinity are included in the first metal film. For example, the first metal film 845 may contain a first type of metal such as titanium, while the second metal film contains two types of metal: the first type of metal (titanium) and a second type of metal, such as a gettering metal, which may be aluminum. The first type of metal in the first metal film and the second metal film may be titanium, or other metals such as nickel, platinum, or alloys thereof.

For instance, certain MIS contact structures, such as embodiments described in FIG. 5 and FIG. 6, the oxygen-rich layer on the semiconductor substrate may have been deliberately grown in place (and a bimetal first metal film containing, e.g., titanium and aluminum, or lanthanum and aluminum, was grown directly atop the oxygen rich layer). In the structure 800, the bimetal film containing a gettering metal is separated from oxygen-rich layer 820.

Consistent with embodiments, a first liner layer 855 has been deposited on second metal layer 850, extending to the sidewall 817 of opening 816. First metal layer 845 and second metal layer 850 also extend within opening 816 to touch sidewall 817 along the perimeter of opening 816. First metal layer 845 may contain at least one metal that is not a gettering metal so as to allow oxygen diffusion through the first metal layer into the second metal layer. Second metal layer 850 may contain at least two metals, one of which may match the metal in first metal layer 845 and one of which is a gettering metal that can react with oxygen from oxygen rich layer 840. The gettering metal being in the second metal film may permit, during annealing, formation of a discrete oxygen-rich region in the contact stack away from the interface of the contact and the semiconductor substrate. Consistent with embodiments of the present disclosure, first metal layer 845 and second metal layer 850 may each have thicknesses between approximately 1 nm and 8 nm. The oxygen-rich region formed during annealing as described in the method of FIG. 7 may be left intact or removed at the discretion of the manufacturer.

Figure 9:
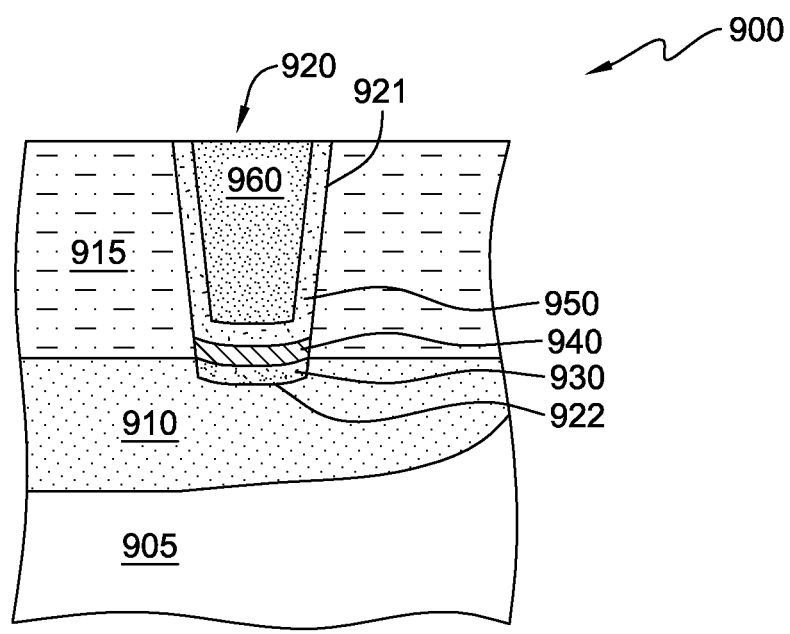
FIG. 9 portrays semiconductor contacts that may be created by processes similar to that of FIG. 7, wherein oxygen present at the bottom of a contact opening has been diffused away from the contact-semiconductor interface prior to deposition of a liner and fill metal, according to embodiments of the disclosure.

FIG. 9 portrays embodiments of a semiconductor contact 900 created by controlled-diffusion methods disclosed herein. The contact 900 may be formed from an intermediate manufacturing structure 800, e.g., by performing a forming gas anneal process, followed by liner deposition and metal fill steps as described in the method of FIG. 7. Alternative embodiments may also include selective etches and cleaning steps following anneal steps in order to remove metallic residues from within the contact structure.

As shown in FIG. 9, a dielectric material 915 has been deposited on top of a silicon-containing region 910 of a semiconductor substrate 905. An opening 920 in the dielectric material has a sidewall 921 and bottom 922. A silicide layer 930 is located on the bottom 922 on the silicon-containing region 910. Silicide layer 930 may be a titanium silicide, titanium-aluminum silicide, or some other metal silicide that is appropriate for particular integration schemes. A metallic layer 940 lies on top of the silicide layer 930. Metallic layer 940 may be formed from a metal stack that includes at least two metal layers sequentially deposited in opening 916, where the metal layers have different compositions and a gettering metal is predominantly located at the upper portion of the metallic layer after the metal stack has been annealed. Some embodiments of the contact may include a gettering-metal oxide in the upper portion of metallic layer 940. In other embodiments, a plasma or wet chemical selective etch may have removed the upper portion of metallic layer 940, including any gettering-metal oxide formed during an anneal step. Embodiments do include a liner layer 950 that rests on metallic layer 940 and that touches sidewall 921. Liner layer 950 may be a liner layer that was deposited after deposition of metal layers and prior to annealing, or it may be a new liner layer that was deposited after a selective etch of the contact opening to remove gettering-metal oxide and the upper portion of metallic layer 940. Metal fill 960 fills the remainder of the volume of the opening 920 above liner layer 950.

As discussed herein, the semiconductor contact 900 can be particularly useful as contacts having a low specific contact resistivity due to a low amount of oxygen in the contact structure and due to the altered physical location of the oxygen within the contact. Oxygen may contaminate materials to form metal oxides that hinder the smooth flow of current through the circuit. In embodiments having a bimetal film as the second metal film shown in FIG. 8 (element 850), a forming gas anneal may promote migration of contaminant oxygen at the surface of the semiconductor substrate upward through the contact until it meets and reacts with a gettering metal in the second metal film (e.g., 850). This gettering metal oxide layer may be removed or left in place depending on the particular requirements of the semiconductor circuit being manufactured.

The specific contact resistivity of a contact formed using methods associated with the present disclosure, such as the method described in FIG. 7 (where a (low temperature) forming gas anneal liberates oxygen from the surface of a semiconductor substrate and drives a reaction between the oxygen and a gettering metal in a bimetallic second metal layer) may be in the range of $5 \times 10^{-8}$ $\Omega$-cm$^2$. Trace amounts of oxide-containing materials such as silicon dioxide may be present at the interface of the contact silicide and the semiconductor substrate. Decreasing the amount of such oxygen-containing materials increases the surface area of the contact silicide that is in direct contact with the semiconductor substrate and consequently decreasing the value of the specific contact resistivity for such contacts. Increasing the size of a contact could also serve to lower the specific contact resistivity, but technology is trending in the opposite direction, toward increasingly small contact sizes. Oxygen depletion through controlled-diffusion methods such as the method described in FIG. 7 may become increasingly important elements of contact formation for smaller-diameter contacts or contact materials that are prone to formation of surface oxides.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments herein.

What is claimed is:

1. A method of forming a contact, the method comprising:
   forming a layer of dielectric material on a silicon-containing region of a semiconductor substrate;
   creating an opening through the layer of dielectric material, the opening having a bottom and exposing the silicon-containing region;
   forming a metal stack within the opening, the metal stack including at least a first metal film on the silicon-containing region and a second metal film on the first metal film;
   annealing the metal stack to cause oxygen to migrate from the substrate to the second metal film by using a forming gas anneal that is performed:
   in an atmosphere at least partially composed of nitrogen gas and hydrogen gas;
   at a temperature of at least 350° C.; and
   for at least 30 minutes;
   forming a first liner within the opening; and
   depositing a fill metal in the opening.

2. A method of forming a contact, the method comprising:
   forming a layer of dielectric material on a silicon-containing region of a semiconductor substrate;
   creating an opening through the layer of dielectric material, the opening having a bottom and exposing the silicon-containing region;

forming, on the exposed silicon-containing region of the semiconductor substrate and through the exposure of the silicon-containing region, a silicon-dioxide layer;

forming a metal stack within the opening, the metal stack including at least a first metal film on the silicon-containing region and a second metal film on the first metal film, wherein the first metal film is about 4 nm in thickness and predominantly titanium, and the second metal film is about 4 nm in thickness and about 50% titanium and about 50% aluminum;

annealing the metal stack to cause oxygen to migrate from the silicon-dioxide layer of the substrate to the second metal film, wherein the annealing forms a gettering-metal oxide in an upper portion of the metal stack;

forming a first liner within the opening;

removing the first liner and the upper portion of the metal stack;

forming a second liner; and depositing a fill metal on the second liner within the opening.

* * * * *